US007053428B2

(12) United States Patent
Boeve

(10) Patent No.: US 7,053,428 B2
(45) Date of Patent: May 30, 2006

(54) DIGITAL MAGNETIC MEMORY CELL DEVICE

(75) Inventor: Hans Boeve, Valkenswaard (NL)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/479,520

(22) PCT Filed: Jun. 11, 2002

(86) PCT No.: PCT/DE02/02127

§ 371 (c)(1),
(2), (4) Date: May 6, 2004

(87) PCT Pub. No.: WO02/101751

PCT Pub. Date: Dec. 19, 2002

(65) Prior Publication Data

US 2004/0188731 A1   Sep. 30, 2004

(30) Foreign Application Priority Data

Jun. 11, 2001   (DE) .............................. 101 28 264

(51) Int. Cl.
*H01L 29/76* (2006.01)

(52) U.S. Cl. ...................... 257/295; 257/298; 257/303; 257/306; 257/324; 257/421; 438/3; 438/240

(58) Field of Classification Search ..................... None
See application file for complete search history.

(56) References Cited

U.S. PATENT DOCUMENTS 5,385,637 A    1/1995  Thayamballi

| 5,917,749 A * | 6/1999 | Chen et al. .................. 365/173 |
| 5,982,660 A * | 11/1999 | Bhattacharyya et al. .... 365/173 |
| 6,114,719 A | 9/2000 | Dill et al. |
| 6,307,708 B1 | 10/2001 | Yoda et al. |
| 2001/0026471 A1 | 10/2001 | Michijima et al. |
| 2002/0047145 A1* | 4/2002 | Nickel ......................... 257/295 |

FOREIGN PATENT DOCUMENTS

| EP | 0 755 086 A2 | 1/1997 |
| EP | 0 982 736 A2 | 3/2000 |

OTHER PUBLICATIONS

Berkov et al., "*Numerical Stimulations of Remagnetization Processes in Sub-µm Multilayer Magnetic Structures*", Tagungsband Statusseminar, Dresden, 2000, pp. 95-99, Innovent e.V., Felsbachstr. 5, D-07745 Jena, Germany.

(Continued)

*Primary Examiner*—Andy Huynh
(74) *Attorney, Agent, or Firm*—Edell, Shapiro & Finnan, LLC

(57) ABSTRACT

A digital magnetic memory cell device for read and/or write operations includes a soft-magnetic read and/or write layer system and at least one hard-magnetic reference layer system formed as an AAF system. The device includes an AAF layer composite and at least one reference layer. The AAF layer composite has two magnetic layers, and the reference layer system includes at least one antiferromagnetic layer arranged adjacent to a magnetic layer of the AAF layer composite. The magnetic layer is remote from the antiferromagnetic layer and has a uniaxial anisotropy pointing in a first direction. The magnetization of the antiferromagnetic layer is oriented in a second direction. The anisotropy direction of the magnetic layer and the magnetization direction of the antiferromagnetic layer are at an angle with respect to one another.

21 Claims, 1 Drawing Sheet

OTHER PUBLICATIONS

Parkin, S.S. et al., *"Exchange-Biased Magnetic Tunnel Junctions and Application to Nonvolatile Magnetic Random Access"*, Journal of Applied Physics, vol. 85, No. 8, Apr. 15, 1999, pp. 5828-5833, IBM Research Division, Almaden Research Center, San Jose, California 95120.

Marrows, C.H., *"Canted Exchange Bias in Antiparallel Biased Spin Valves"*, Journal of Applied Physics, vol. 87, No. 9, May 1, 2000, pp. 5058-5060, Dept. of Physics and Astronony, E.C. Stoner Laboratory, University of Leeds, Leeds LS2 9JT United Kingdom.

Oliveira et al., *"Improvement of Thermal Stability and Magnetoresistance Recovery of Tb25Co75 Baised Spin-Valve Heads"*, Journal of Applied Physics, vol. 81, No. 8, Apr. 15, 1997, pp. 4903-4905, INESC, R. Alves Redel 9-1, 1000 Lisboa, Portugal.

* cited by examiner

DIGITAL MAGNETIC MEMORY CELL DEVICE

This application is a 371 of PCT/DE02/02127 filed Jun. 11, 2002.

FIELD OF THE INVENTION

The invention relates to a digital magnetic memory cell device for read and/or write operations.

SUMMARY

A digital memory cell device of this type serves to magnetically store information. An individual memory cell device is generally part of a memory device, often also called MRAM (magnetic random access memory). A memory of this type can be used to carry out read and/or write operations. Each individual memory cell device comprises a soft-magnetic read and/or write layer system, which is separated by an intermediate layer from a hard-magnetic reference layer system, formed as an AAF system in the case of the present type of memory cell device. The magnetization of the reference layer of the reference layer system is stable and does not change in an applied field, while the magnetization of the soft-magnetic read and/or write layer system can be switched by an applied field. The two magnetic layer systems can be magnetized parallel or antiparallel with respect to one another. The two aforementioned states in each case represent a bit of information, i.e., the logic zero ("0") state or one ("1") state. If the relative orientation of the magnetization of the two layers changes from parallel to antiparallel, or vice versa, then the magnetoresistance across this layer structure changes by a few percent. This change in resistance can be used for the read digital information stored in the memory cell. The change in the cell resistance can be identified by a voltage change. By way of example, in the event of a voltage increase, the cell may be occupied by a logic zero ("0") and, in the event of a voltage decrease, the cell may be occupied by a logic one ("1"). Particularly large resistance changes in the region of a few percent have been observed when the magnetization orientation changed from parallel to antiparallel and vice versa in cell structures of the GMR type (giant magnetoresistance) or the TMR type (tunnel magnetoresistance).

An important advantage of such magnetic memory cells is that the information is stored in a persistent manner, is stored without maintenance of any basic power supply even with the device switched off, and is immediately available again after the device is switched on, unlike in known conventional semiconductor memories.

A central component is the reference layer system formed as an AAF system (AAF=artificial antiferromagnetic). Such an AAF system is advantageous on account of its high magnetic rigidity and the relatively low coupling to the read and/or write layer system through the so-called orange peel effect and/or through macroscopic magnetostatic coupling fields. An AAF system generally comprises a first magnetic layer or magnetic layer system, an antiferromagnetic coupling layer and a second magnetic layer or magnetic layer system which is coupled by its magnetization, via the antiferromagnetic coupling layer, opposite of the magnetization of the lower magnetic layer. Such an AAF system can be formed, e.g., from two magnetic Co layers and an antiferromagnetic coupling layer made of Cu.

In order to improve the rigidity of the AAF system, that is to say its resistance to external fields, it is customary to arrange an antiferromagnetic layer at the magnetic layer of the AAF systems, which is remote from the read and/or write layer system. By this antiferromagnetic layer, the directly adjacent magnetic layer is additionally pinned in its magnetization, so that overall the AAF system becomes harder (exchange pinning or exchange biasing).

An AAF layer composite normally comprises two ferromagnetic magnetic layers, e.g., made of Co, which are coupled to one another via an antiparallel coupling intermediate layer, e.g., made of Cu. Owing to the RKKY coupling between the two layers, an antiparallel state is established in the absence of an external magnetic field. In other words, the magnetization of the two magnetic layers are antiparallel to one another. The magnetic rigidity of the AAF system corresponds to the amplitude of the applied external field, which is required to rotate the magnetizations of the two layers in the same direction, i.e., parallel to one another. In order to produce the antiparallel state, the AAF layer composite or the AAF system is first magnetized with an external magnetic field, which lays in the direction of an axis of a magnetic layer. The thinner layer, which has fewer magnetic moments than the thicker layer, then rotates in the antiparallel direction due to antiparallel coupling. A rotation process takes place in both layers. The thicker layer rotates slightly from the original orientation and subsequently rotates back again. The thinner layer rotates in excess of 180°, but this occasionally leads, in a disadvantageous manner, to the formation of domains or domain walls in this layer. 360° walls can then form. The latter are disadvantageous, however, in possible functionally dictated rotation processes of the device.

The invention is based on the problem of specifying a memory cell device in which domain formation during magnetization can be largely prevented.

In order to solve this problem, a digital magnetic memory cell device includes a magnetic layer, arranged remote from an antiferromagnetic layer, that has a uniaxial anisotropy pointing in a first direction, and the magnetization of the antiferromagnetic layer is oriented in a second direction. The anisotropy direction of the magnetic layer and the magnetization direction of the antiferromagnetic layer are angled with respect to one another.

In the case of the memory cell device according to the invention, a uniaxial anisotropy pointing in a first direction is induced in one magnetic layer. The anisotropy is at an angle with respect to the magnetization of an antiferromagnetic layer and thus also with respect to the magnetization of a second magnetic layer coupled thereto. The second magnetic layer is pinned by the antiferromagnetic layer. the magnetizations. The magnetization of the two magnetic layers are at an angle with respect to one another. If an external magnetic field, which lies between the two directions is then applied, for example, for magnetizing the system, then first the two magnetizations rotate in the field direction due to the external magnetic field. If the external magnetic field is lowered, then the direction of rotation of the respective magnetization is induced in a direction due to two different effects. The magnetization of the magnetic layer, which lies remote from the antiferromagnetic layer and in which the anisotropy was induced, can rotate in the direction of the anisotropy. By contrast, the magnetization of the other magnetic layer can rotate in the opposite direction on account of the incipient coupling to the antiferromagnetic layer. On account of the induced anisotropy and the magnetization of the antiferromagnetic layer that is at an angle relative thereto, the respective layer magnetization consequently receives an anisotropy- or coupling-dictated angular momentum in the respective distinguished direction. Given a sufficiently small field, sufficient coupling is achieved between the antiferromagnetic layer, e.g., a natural antiferromagnet, and the overlying ferromagnetic magnetic layer, for which reason the latter has virtually reached its end orientation. Upon further lowering of the external field, with the incipient antiparallel coupling of the second magnetic layer to the first, the latter can rotate beyond the anisotropy direction into an antiparallel state.

On account of the lacuna through the anisotropy and the magnetization, at an angle with respect thereto, of the antiferromagnetic layer and with the magnetization of the coupled magnetic layer, in each of the magnetic layers, a specific direction of rotation or a specific direction of rotation contribution, which advantageously prevents domain formation or wall formation during the rotation process, can be induced.

The anisotropy direction and the magnetization direction can be at an angle less than 90°, preferably less than 60°, with respect to one another. An intermediate angle can be selected. The anisotropy of the magnetic layer may be induced during production by deposition of the magnetic layer in a magnetic field oriented in the first direction. Other induction methods are also possible as long as the anisotropy can be induced under a defined direction. The magnetization of the antiferromagnetic layer is oriented in a thermal annealing step with the presence of a magnetic field directed in the second direction. For the orientation of the antiferromagnetic layer, the latter is heated above the blocking temperature and cooled in the presence of the orientation field, which is at an angle with respect to the anisotropy already induced.

The two magnetic layers of the memory cell device may have different thicknesses. In addition, however, it is also conceivable to provide layers having the same thickness so that the layer system of the AAF exhibits no net moment.

Furthermore, the first and second directions can be as symmetrical as possible with respect to a given anisotropy of the memory cell device, in other words, the shape anisotropy direction runs at an intermediate angle between the two directions. An external field can be applied in the shape anisotropy direction.

The memory cell device itself can be a giant magnetoresistive, a magnetic tunnel junction, or a spin valve transistor device.

In addition to the memory cell device itself, the digital memory device can include a plurality of memory cell devices of the above-described type.

Moreover, the invention furthermore relates to a method for producing a digital memory cell device having a soft-magnetic read and!or write layer system and at least one hard-magnetic reference layer system formed as an AAF system, comprising an AAF layer composite and at least one reference layer, the AAF layer composite having two magnetic layers, and the reference layer system comprising at least one antiferromagnetic layer arranged adjacent to a magnetic layer of the AAF layer composite. Such a method can conclude a uniaxial anisotropy pointing in a first direction that is induced in a magnetic layer arranged remote from an antiferromagnetic layer, which is effected by deposition of the magnetic layer in a magnetic field oriented in a first direction, and that the magnetization of the antiferromagnetic layer is subsequently oriented in a second direction, which is effected in a thermal annealing step with the presence of a magnetic field directed in a second direction. The anisotropy direction of the magnetic layer and the magnetization direction of the antiferromagnetic layer are at an angle with respect to one another.

Further advantages of the method according to the invention can be gathered from the dependent subclaims.

BRIEF DESCRIPTION OF THE DRAWINGS

Further advantages, features and details of the invention emerge from the exemplary embodiment described below and also with reference to the drawings, in which.

DETAILED DESCRIPTION

Figure 1:
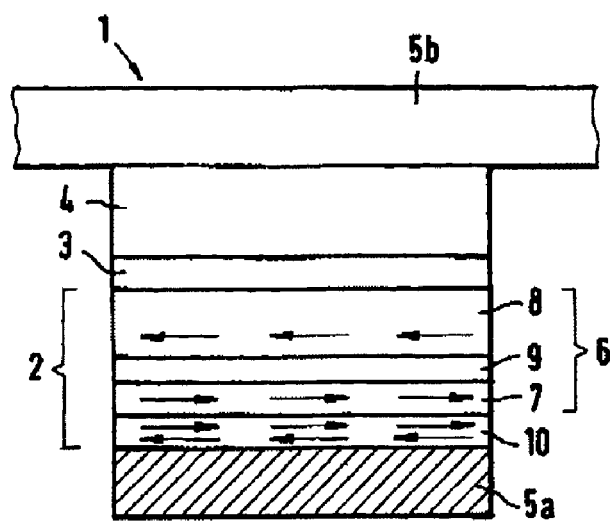
FIG. 1 shows a basic diagrammatic sketch of a memory cell device according to the invention in a sectional view.

FIG. 1 shows a memory cell device 1 according to the invention. This device comprises a reference layer system 2, which is decoupled from a soft-magnetic read and/or write layer system 4 via a decoupling layer 3. The illustration furthermore shows the word and bit lines 5a, 5b running above and below at right angles to one another. The reference layer system 2 comprises an AAF layer composite (AAF=artificial antiferromagnetic), comprising a lower ferromagnetic layer 7, an upper ferromagnetic layer 8 and a coupling layer 9 which is arranged between these layers and couples the magnetizations of the two layers in antiparallel fashion. The construction and the method of operation of such an AAF layer composite or system are sufficiently known.

Arranged below the lower ferromagnetic layer 7 is an antiferromagnetic layer 10. The latter may comprise the customary known layer materials such as, e.g., NiO, FeMn, TbCo, NiMn, IrMn, PtMn, CrPtMn, RhMn, or PdMn and may have a thickness of up to, e.g., approximately 30 nm. This antiferromagnetic layer 10, also called exchange coupling layer or exchange biasing layer, serves for pinning the magnetization of the ferromagnetic magnetic layer 7. The latter is oriented, as shown in FIG. 1, parallel to the magnetization of the topmost layer of the antiferromagnetic layer.

Figure 2:
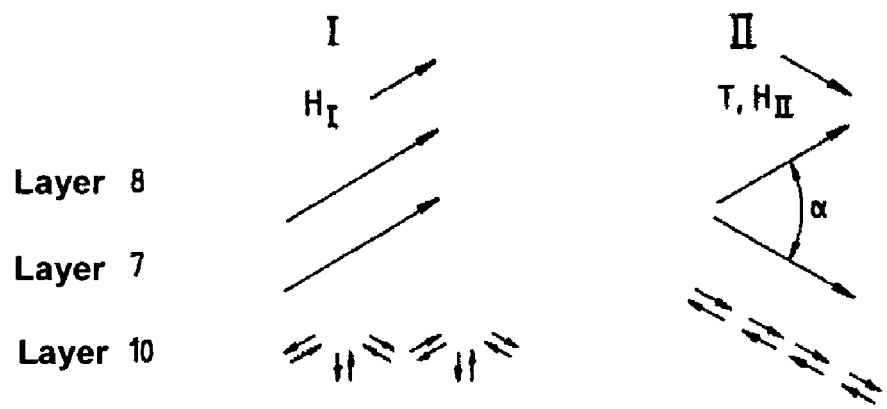
FIG. 2 shows a basic diagrammatic sketch for illustrating the different directions of the anisotropy and of the magnetization of the antiferromagnetic layer.
Figure 2:
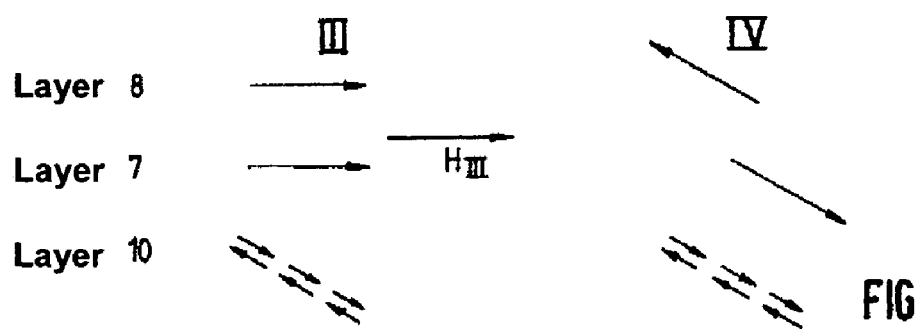

FIG. 2 shows, in the form of a basic diagrammatic sketch, the production of the anisotropy and also the setting of the magnetization of the lower soft-magnetic layer and of the antiferromagnetic layer.

Firstly, in step I, after the antiferromagnetic layer 10 has already been deposited, the layers 7 and 8 (and between them, of course, the coupling layer that couples in an antiparallel fashion) are deposited. The deposition is effected with the presence of a magnetic field HI, which is oriented in a specific direction specified by the assigned arrow. As a result of this, an anisotropy is induced both in the layer 7 and in the layer 8, as is illustrated by the two arrows. After the layers have been applied, the anisotropy magnetic field HI is reduced to zero. In addition to inducing an anisotropy in both layers 7, 8, it is also conceivable, however, to induce an anisotropy only in the upper layer 8.

The magnetization of the antiferromagnetic layer 10 is then set in step II. For this purpose, the temperature is increased to a temperature above the blocking temperature of the antiferromagnetic layer 10 and, at the same time, a setting magnetic field is applied, which is identified by $H_{II}$ in FIG. 2. The direction of the magnetic field is likewise specified by the assigned arrow and is at an angle α with respect to the direction of the magnetic field $H_I$ acting in step I. This has the effect that the previously randomly directed magnetic moments of the antiferromagnetic layer 10 (see FIG. 1) are oriented and line up in the direction of the external setting magnetic field. If the temperature and the field $H_{II}$ are then reduced, the exchange coupling between the layer 10 and the layer 7 commences, which has the effect that the magnetization of the layer 7, as indicated by the arrow, rotates parallel to the magnetization of the topmost layer of the antiferromagnetic layer 10.

If the memory cell device is then intended to be magnetized, an external magnetizing field $H_{III}$ is applied, which, in the example shown, lies in the central intermediate angle between the set anisotropy of the layer 8 and the coupled magnetization of the layer 7. Given a sufficiently high field $H_{III}$, the magnetizations of the layer 8 and of the layer 7 rotate parallel to the field direction. If the magnetizing field $H_{III}$ is then reduced, firstly the exchange coupling between the antiferromagnetic layer 10 and the magnetic layer 7 commences, in other words the magnetization of the layer 7 rotates parallel to the magnetization of the layer 10. Since the direction of the magnetizing field $H_{III}$ lies between the two components which influence the respective direction of the magnetization of the layers 7, 8, namely firstly the anisotropy of the layer 8 and secondly the orientation of the natural antiferromagnet of the layer 10, the magnetization of the layer 8 experiences a preferential rotation component in the direction of the anisotropy of the layer 8. It thus rotates preferentially in this direction. Upon further lowering of the external field, the magnetization of the layer 8 rotates further on account of the incipient antiparallel coupling between the layers 7 and 8 and ideally establishes itself antiparallel to the magnetization of the layer 7.

Since, on account of the different directions of the anisotropy of the layer 8 and of the magnetization of the layer 10 after the application of an external setting field, the magnetizations of the layers 7 and 8 each receive a movement component in the opposite lacuna or a movement impulse in the respective preferential direction, the situation where any domains or domain walls form during the rotation processes is advantageously avoided.

Figure 3:
FIG. 3 shows a basic diagrammatic sketch for illustrating the directional course relative to a shape anisotropy of the system.

FIG. 3 shows, as a basic diagrammatic sketch, that the respective relevant directions of the anisotropy and of the magnetization are placed most expediently in a manner dependent on a possible given shape anisotropy of the memory cell device, that is to say preferably symmetrically with respect thereto. The situation where the shape anisotropy disturbs the effect that can be obtained on account of the positioning of the respective directions at an angle with respect to one another is avoided in this way.

A number of implementations have been described. Nevertheless, it will be understood that various modifications may be made without departing from the spirit and scope. Accordingly, other embodiments are within the scope of the following claims.

LIST OF REFERENCE SYMBOLS

1 Memory cell device
2 Reference layer system
3 Decoupling layer
4 Read and/or write layer system
5a Word and bit lines
5b Word and bit lines
5 Ferromagnetic layer
6 AAF layer composite
7 Lower ferromagnetic layer
8 Upper ferromagnetic layer
9 Coupling layer
10 Antiferromagnetic layer

I claim:

1. A digital magnetic memory cell device for read and/or write operations, comprising:
a soft-magnetic read and/or write layer system; and
at least one hard-magnetic reference layer system, formed as an AAF system including an AAF layer composite and at least one reference layer, the AAF layer composite comprising first and second magnetic layers, and the reference layer further including at least one antiferromagnetic layer arranged adjacent to the first magnetic layer of the AAF layer composite, wherein the second magnetic layer is remote from the antiferromagnetic layer and has a uniaxial anisotropy in a first direction, magnetization of the antiferromagnetic layer being oriented in a second direction, the anisotropy direction of the second magnetic layer and the magnetization direction of the antiferromagnetic layer being at an angle with respect to one another.

2. The digital memory cell device according to claim 1, wherein the anisotropy direction and the magnetization direction are at an angle less than 90° with respect to one another.

3. The digital memory cell device according to claim 1, wherein the anisotropy of the second magnetic layer is induced during production by deposition of the second magnetic layer in a magnetic field oriented in the first direction and the magnetization of the antiferromagnetic layer is set in a thermal annealing step with the presence of a magnetic field directed in the second direction.

4. The digital memory cell device according to claim 1, wherein the first and second magnetic layers have different thicknesses.

5. The digital memory cell device according to claim 1, wherein the first and second directions are as symmetrical as possible with respect to a predetermined shape anisotropy of the memory cell device.

6. The digital memory cell device according to claim 1, wherein the digital memory cell device is one of a giant magnetoresistive, a magnetic tunnel junction, and a spin valve transistor device.

7. A digital memory device, comprising:
a plurality of digital memory cell devices including a digital magnetic memory cell device for read and/or write operations, each digital memory cell device having a soft-magnetic read and/or write layer system, and at least one hard-magnetic reference layer system formed as an AAF system including an AAF layer composite and at least one reference layer, the AAF layer composite comprising first and second magnetic layers, and the reference layer further including at least one antiferromagnetic layer arranged adjacent to the first magnetic layer of the AAF layer composite, wherein the second magnetic layer is remote from the antiferromagnetic layer and has a uniaxial anisotropy in a first direction, magnetization of the antiferromagnetic layer being oriented in a second direction, the anisotropy direction of the second magnetic layer and the magnetization direction of the antiferromagnetic layer being at an angle with respect to one another.

8. A method for producing a digital memory cell device, comprising:

forming a soft-magnetic read and/or write layer system;

forming at least one hard-magnetic reference layer system as an AAF system including an AAF layer composite and at least one reference layer, the AAF layer composite comprising first and second magnetic layers, and the reference layer further including at least one antiferromagnetic layer arranged adjacent to the first magnetic layer of the AAF layer composite; and inducing a uniaxial anisotropy pointing in a first direction in the second magnetic layer arranged remote from the antiferromagnetic layer, magnetization of the antiferromagnetic layer being subsequently oriented in a second direction, the anisotropy direction of the second magnetic layer and the magnetization direction of the antiferromagnetic layer being at an angle with respect to one another.

9. The method according to claim 8, wherein the anisotropy direction and the magnetization direction are set at an angle less than 90° with respect to one another.

10. The method according to claim 8, wherein the anisotropy of the second magnetic layer is induced during production by deposition of the second magnetic layer in a magnetic field oriented in the first direction and magnetization of the antiferromagnetic layer is set in a thermal annealing step in the presence of a magnetic field directed in the second direction.

11. The method according to claim 8 wherein the first and second directions are as symmetrical as possible with regard to a predetermined shape anisotropy of the memory cell device.

12. The digital memory cell device according to claim 2, wherein the angle is less than 60°.

13. The digital memory cell device according to claim 1, wherein the first and second magnetic layers have the same thickness.

14. The digital memory cell device according to claim 7, wherein the anisotropy direction and the magnetization direction are at an angle less than 90° with respect to one another.

15. The digital memory cell device according to claim 14, wherein the angle is less than 60°.

16. The digital memory cell device according to claim 7, wherein the anisotropy of the second magnetic layer is induced during production by deposition of the second magnetic layer in a magnetic field oriented in the first direction and the magnetization of the antiferromagnetic layer is set in a thermal annealing step with the presence of a magnetic field directed in the second direction.

17. The digital memory cell device according to claim 7, wherein the first and second magnetic layers have different thicknesses.

18. The digital memory cell device according to claim 7, wherein the first and second magnetic layers have the same thickness.

19. The digital memory cell device according to claim 7, wherein the first and second directions are as far symmetrical as possible with respect to a given shape anisotropy of the memory cell device.

20. The digital memory cell device according to claim 7, wherein the digital memory cell device is one of a giant magnetoresistive, a magnetic tunnel junction, and a spin valve transistor device.

21. The method according to claim 9, wherein the angle is less than 60°.

* * * * *